United States Patent
Groe et al.

(10) Patent No.: US 7,496,338 B1
(45) Date of Patent: Feb. 24, 2009

(54) MULTI-SEGMENT GAIN CONTROL SYSTEM

(75) Inventors: John Groe, Poway, CA (US); Naone Farias, San Diego, CA (US); Damian Costa, San Diego, CA (US); Babak Nejati, San Diego, CA (US)

(73) Assignee: Sequoia Communications, SD, CA (US)

( * ) Notice: Subject to any disclaimer, the term of this patent is extended or adjusted under 35 U.S.C. 154(b) by 348 days.

(21) Appl. No.: 11/027,710

(22) Filed: Dec. 29, 2004

Related U.S. Application Data

(60) Provisional application No. 60/533,523, filed on Dec. 29, 2003.

(51) Int. Cl.
  *H04B 1/06* (2006.01)
  *H03G 5/16* (2006.01)
  *H03F 3/45* (2006.01)

(52) U.S. Cl. .............. 455/240.1; 455/241.1; 455/245.2; 455/251.1; 330/133; 330/254; 330/310

(58) Field of Classification Search .............. 455/234.1, 455/240.1, 241.1, 245.2, 251.1; 330/133, 330/254, 310
See application file for complete search history.

(56) References Cited

U.S. PATENT DOCUMENTS

| | | | |
|---|---|---|---|
| 448,539 A | 3/1891 | Morris | |
| 599,071 A | 2/1898 | Barr | |
| 4,198,675 A * | 4/1980 | Moore | 702/124 |
| 4,263,560 A * | 4/1981 | Ricker | 330/129 |
| 4,430,627 A | 2/1984 | Machida | |
| 4,769,588 A * | 9/1988 | Panther | 323/280 |
| 4,816,772 A * | 3/1989 | Klotz | 330/254 |
| 4,926,135 A | 5/1990 | Voorman | |
| 4,965,531 A | 10/1990 | Riley | |
| 4,994,768 A | 2/1991 | Shepherd et al. | |
| 5,006,818 A | 4/1991 | Koyama et al. | |
| 5,015,968 A | 5/1991 | Podell et al. | |
| 5,030,923 A | 7/1991 | Arai | |
| 5,289,136 A | 2/1994 | DeVeirman et al. | |
| 5,331,292 A | 7/1994 | Worden et al. | |
| 5,399,990 A | 3/1995 | Miyake | |
| 5,451,901 A * | 9/1995 | Welland | 330/133 |
| 5,491,450 A | 2/1996 | Helms et al. | |
| 5,508,660 A | 4/1996 | Gersbach et al. | |
| 5,548,594 A | 8/1996 | Nakamura | |
| 5,561,385 A | 10/1996 | Choi | |
| 5,581,216 A | 12/1996 | Ruetz | |
| 5,631,587 A | 5/1997 | Co et al. | |
| 5,648,744 A | 7/1997 | Prakash et al. | |
| 5,677,646 A | 10/1997 | Entrikin | |
| 5,739,730 A | 4/1998 | Rotzoll | |
| 5,767,748 A | 6/1998 | Nakao | |
| 5,818,303 A | 10/1998 | Oishi et al. | |
| 5,834,987 A | 11/1998 | Dent | |
| 5,841,320 A * | 11/1998 | Ichihara | 330/133 |
| 5,862,465 A | 1/1999 | Ou | |

(Continued)

*Primary Examiner*—Duc M Nguyen
(74) *Attorney, Agent, or Firm*—Daniel Tagliaferri, Esq.; Cooley Godward Kronish LLP

(57) ABSTRACT

Multi-segment gain control system. Apparatus is provided for a multi-segment gain control. The apparatus includes logic to convert a gain control signal to an exponential signal, and logic to map the exponential signal to multiple control signals that are used to control multiple gain stages to produce linear multi-segment gain control.

6 Claims, 8 Drawing Sheets

U.S. PATENT DOCUMENTS

| | | | |
|---|---|---|---|
| 5,878,101 A | 3/1999 | Aisaka | |
| 5,880,618 A * | 3/1999 | Koen | 327/351 |
| 5,880,631 A | 3/1999 | Sahota | |
| 5,939,922 A | 8/1999 | Umeda | |
| 5,945,855 A | 8/1999 | Momtaz | |
| 5,949,286 A | 9/1999 | Jones | |
| 5,990,740 A | 11/1999 | Groe | |
| 5,994,959 A | 11/1999 | Ainsworth | |
| 5,999,056 A | 12/1999 | Fong | |
| 6,011,437 A * | 1/2000 | Sutardja et al. | 330/254 |
| 6,018,651 A | 1/2000 | Bruckert et al. | |
| 6,044,124 A | 3/2000 | Monahan et al. | |
| 6,052,035 A | 4/2000 | Nolan et al. | |
| 6,057,739 A | 5/2000 | Crowley et al. | |
| 6,060,935 A | 5/2000 | Shulman | |
| 6,091,307 A | 7/2000 | Nelson | |
| 6,100,767 A | 8/2000 | Sumi | |
| 6,107,878 A * | 8/2000 | Black | 330/129 |
| 6,114,920 A | 9/2000 | Moon et al. | |
| 6,163,207 A | 12/2000 | Kattner et al. | |
| 6,173,011 B1 | 1/2001 | Rey et al. | |
| 6,191,956 B1 | 2/2001 | Foreman | |
| 6,204,728 B1 | 3/2001 | Hageraats | |
| 6,211,737 B1 | 4/2001 | Fong | |
| 6,229,374 B1 | 5/2001 | Tammone, Jr. | |
| 6,234,387 B1 | 5/2001 | Cuthbert et al. | |
| 6,246,289 B1 | 6/2001 | Pisati et al. | |
| 6,255,889 B1 | 7/2001 | Branson | |
| 6,259,321 B1 * | 7/2001 | Song et al. | 330/254 |
| 6,288,609 B1 | 9/2001 | Brueske et al. | |
| 6,298,093 B1 | 10/2001 | Genrich | |
| 6,333,675 B1 * | 12/2001 | Saito | 330/133 |
| 6,370,372 B1 | 4/2002 | Molnar et al. | |
| 6,392,487 B1 | 5/2002 | Alexanian | |
| 6,404,252 B1 | 6/2002 | Wilsch | |
| 6,476,660 B1 | 11/2002 | Visocchi et al. | |
| 6,515,553 B1 | 2/2003 | Filiol et al. | |
| 6,525,606 B1 * | 2/2003 | Atkinson | 330/133 |
| 6,549,078 B1 | 4/2003 | Sridharan et al. | |
| 6,559,717 B1 * | 5/2003 | Lynn et al. | 330/133 |
| 6,560,448 B1 | 5/2003 | Baldwin et al. | |
| 6,571,083 B1 | 5/2003 | Powell, II et al. | |
| 6,577,190 B2 * | 6/2003 | Kim | 330/133 |
| 6,583,671 B2 | 6/2003 | Chatwin | |
| 6,583,675 B2 | 6/2003 | Gomez | |
| 6,639,474 B2 | 10/2003 | Asikainen et al. | |
| 6,664,865 B2 | 12/2003 | Groe et al. | |
| 6,683,509 B2 | 1/2004 | Albon et al. | |
| 6,693,977 B2 | 2/2004 | Katayama et al. | |
| 6,703,887 B2 | 3/2004 | Groe | |
| 6,711,391 B1 * | 3/2004 | Walker et al. | 455/234.1 |
| 6,724,235 B2 * | 4/2004 | Costa et al. | 327/378 |
| 6,734,736 B2 * | 5/2004 | Gharpurey | 330/254 |
| 6,744,319 B2 * | 6/2004 | Kim | 330/254 |
| 6,751,272 B1 | 6/2004 | Burns et al. | |
| 6,753,738 B1 | 6/2004 | Baird | |
| 6,763,228 B2 | 7/2004 | Prentice et al. | |
| 6,774,740 B1 | 8/2004 | Groe | |
| 6,777,999 B2 * | 8/2004 | Kanou et al. | 327/346 |
| 6,781,425 B2 | 8/2004 | Si | |
| 6,791,413 B2 * | 9/2004 | Komurasaki et al. | 330/254 |
| 6,795,843 B1 | 9/2004 | Groe | |
| 6,798,290 B2 | 9/2004 | Groe et al. | |
| 6,801,089 B2 | 10/2004 | Costa et al. | |
| 6,845,139 B2 | 1/2005 | Gibbons | |
| 6,856,205 B1 | 2/2005 | Groe | |
| 6,870,411 B2 | 3/2005 | Shibahara et al. | |
| 6,894,564 B1 * | 5/2005 | Gilbert | 330/254 |
| 6,917,719 B2 | 7/2005 | Chadwick | |
| 6,940,356 B2 | 9/2005 | McDonald, II et al. | |
| 6,943,600 B2 | 9/2005 | Craninckx | |
| 6,975,687 B2 | 12/2005 | Jackson et al. | |
| 6,985,703 B2 | 1/2006 | Groe et al. | |
| 6,990,327 B2 | 1/2006 | Zheng et al. | |
| 7,062,248 B2 | 6/2006 | Kuiri | |
| 7,065,334 B1 * | 6/2006 | Otaka et al. | 455/232.1 |
| 7,088,979 B1 | 8/2006 | Shenoy et al. | |
| 7,123,102 B2 | 10/2006 | Uozumi et al. | |
| 7,142,062 B2 | 11/2006 | Vaananen et al. | |
| 7,148,764 B2 | 12/2006 | Kasahara et al. | |
| 7,171,170 B2 | 1/2007 | Groe et al. | |
| 7,215,215 B2 | 5/2007 | Hirano et al. | |
| 2002/0031191 A1 | 3/2002 | Shimizu | |
| 2002/0071497 A1 | 6/2002 | Bengtsson et al. | |
| 2002/0193009 A1 | 12/2002 | Reed | |
| 2002/0197975 A1 * | 12/2002 | Chen | 455/324 |
| 2003/0078016 A1 | 4/2003 | Groe et al. | |
| 2003/0092405 A1 | 5/2003 | Groe et al. | |
| 2003/0118143 A1 | 6/2003 | Bellaouar et al. | |
| 2003/0197564 A1 | 10/2003 | Humphreys et al. | |
| 2004/0017852 A1 | 1/2004 | Redman-White | |
| 2004/0051590 A1 | 3/2004 | Perrott et al. | |
| 2005/0093631 A1 | 5/2005 | Groe | |
| 2005/0099232 A1 | 5/2005 | Groe et al. | |

* cited by examiner

MULTI-SEGMENT GAIN CONTROL SYSTEM

CROSS REFERENCE TO RELATED APPLICATIONS

The present application claims the benefit of priority from a co-pending U.S. Provisional patent application entitled "System for a Multi-segment AGC Circuit" having Ser. No. 60/533,523 and filed on Dec. 29, 2003, the disclosure of which is incorporated by reference herein in its entirety for all purposes.

FIELD

The present invention relates generally to gain control circuits, and more particularly to a system for providing multi-segment gain control.

BACKGROUND

Variable gain amplifiers find widespread use in wireless transceivers. They are used in receivers to compensate for varying input levels and in transmitters to adjust the output power level.

A typical receiver includes a switched-gain low noise amplifier (LNA) and multiple baseband variable gain amplifiers. The switched-gain LNA provides at least two modes—high gain and bypass. It invariably suffers from switching transients that adversely affect the magnitude and phase of the received signal, which can be avoided with an LNA offering continuous gain control.

The receiver is generally characterized by its sensitivity and selectivity. The sensitivity of the radio receiver measures the minimum signal that can be detected and demodulated. This takes into account the noise figure of the radio receiver FT, the bandwidth B of the system, and the performance of the demodulator.

The noise figure of a cascaded radio receiver depends on the gain and noise contributed by each circuit, with the first few stages dominating. The selectivity, or linearity, of the radio receiver indicates the largest interfering signal that can be rejected by the system. These signals create intermodulation distortion products that increase rapidly as the interfering signal level increases and degrade receiver signal quality. As a result, the later stages in the receiver system dictate overall linearity.

The sensitivity and selectivity of the radio receiver create conflicting requirements. It therefore becomes advantageous to adapt the receiver to the operating environment and this requires individual control of the LNA and all the variable gain amplifiers.

A transmitter similarly uses baseband and radio frequency (rf) variable gain amplifiers to set the output power level, which varies dramatically in some systems such as in code division multiple access (CDMA) systems.

The transmitter is generally characterized by its maximum output power, distortion, and efficiency. The maximum output power relates to the range of the radio transmitter. It's limited by distortion, which causes spectral regrowth and interferes with nearby radio channels. In turn, amplifier distortion depends on the input signal amplitude and the operating bias, which ties directly to the efficiency of the system.

The gain of the different variable gain amplifiers directly affects the performance of the transmitter. As such, it becomes advantageous to adjust the transmitter based on its output power level and this requires control of each variable gain amplifier.

An automatic gain control (AGC) network must provide monotonic gain control with some precision; otherwise, problems develop due to feedback. Ideally, the AGC network also displays a linear-dB control response. The resulting linear control signal varies exponentially and greatly magnifies errors plus discontinuities due to segmenting of the gain control response. It would therefore be advantageous to have an AGC network that operates to overcome the above problems.

SUMMARY

In one or more embodiments, a multi-segment gain control system is provided that comprises an AGC system that optimally maps a single control signal to multiple variable gain amplifiers to allow the gain of each amplifier to be adjusted independently resulting in a smooth overall gain response, and thereby achieving greater flexibility and superior performance.

In one embodiment, apparatus is provided for a multi-segment gain control. The apparatus comprises logic to convert a gain control signal to an exponential signal, and logic to map the exponential signal to two or more control signals that are used to control two or more gain stages to produce linear multi-segment gain control.

In one embodiment, apparatus is provided for a multi-segment gain control. The apparatus comprises means for converting a gain control signal to an exponential signal, and means for mapping the exponential signal to two or more control signals that are used to control two or more gain stages to produce linear multi-segment gain control.

In one embodiment, a communication device is provided that comprises apparatus for providing a multi-segment gain control. The apparatus comprises logic to convert a gain control signal to an exponential signal, and logic to map the exponential signal to two or more control signals that are used to control two or more gain stages to produce linear multi-segment gain control.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein.

DETAILED DESCRIPTION

In one or more embodiments, a multi-segment gain control system is provided that comprises an AGC system that optimally maps a single control signal to multiple variable gain amplifiers to allow the gain of each amplifier to be adjusted independently resulting in a smooth overall gain response.

Figure 1:
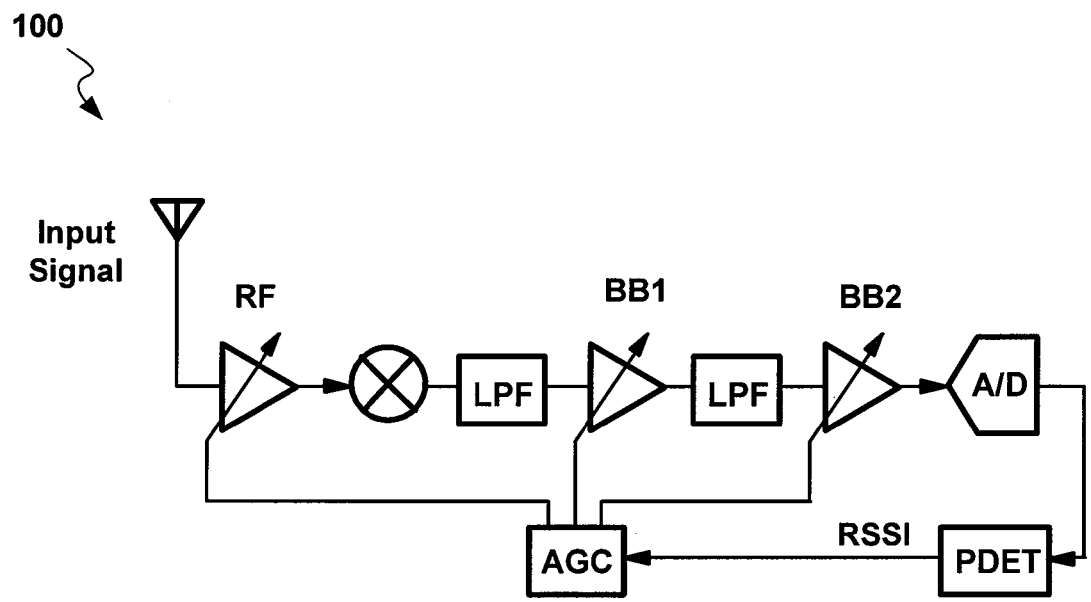
FIG. 1 shows a diagram of a wireless receiver that comprises one embodiment of a multi-segment gain control system.

FIG. 1 shows a diagram of a wireless receiver that comprises one embodiment of a multi-segment gain control system. The gain control system comprises an AGC circuit that controls the gain of multiple variable-gain amplifiers (rf and baseband "bb") independently (via control signals 102) and thereby maximizes the receiver's performance. The AGC uses a "received signal strength indicator" (RSSI) signal that represents the power of the received signal in dB to adjust the system gain. Since most variable gain amplifiers require linear control, the RSSI signal must be converted from dB to linear format to form a basis for the control signals 102.

Figure 2:
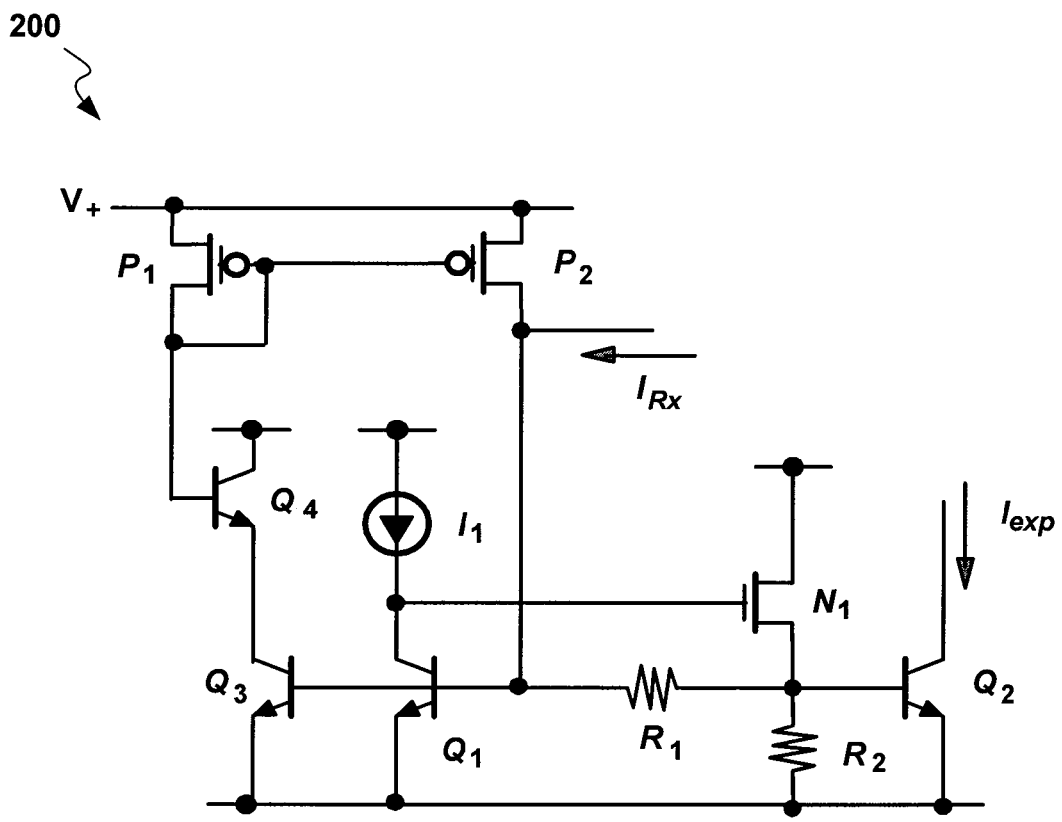
FIG. 2 shows a diagram of one embodiment of an exponential current generator.

FIG. 2 shows one embodiment of an exponential generator that operates to convert the RSSI signal from dB to linear format. The exponential generator may be included as part of the AGC circuit shown in FIG. 1. The exponential generator receives a signal $I_{RX}$ that represents the RSSI signal and operates to generate the current $I_{exp}$. Current $I_1$ develops a base-emitter voltage across transistor $Q_1$ that mirrors to transistor $Q_2$ through resistor $R_1$. The resulting loop equation is;

$$V_{be1} = I_{Rx}R_1 + V_{be2}$$

where $I_{Rx}$ represents the RSSI signal (and is inversely related to the required gain). This equation can be rewritten as;

$$I_{exp} = I_1 \exp\left(-\frac{I_{Rx}R_1}{V_T}\right)$$

where $V_T$ is the thermal voltage. During operation, the transistor loop (comprising devices $Q_3$, $Q_4$ and $P_1$, $P_2$) biases transistor $Q_1$, while transistor $N_1$ provides the base current for transistor $Q_2$. Resistor $R_2$ provides a current source for transistor $N_1$.

Figure 3:
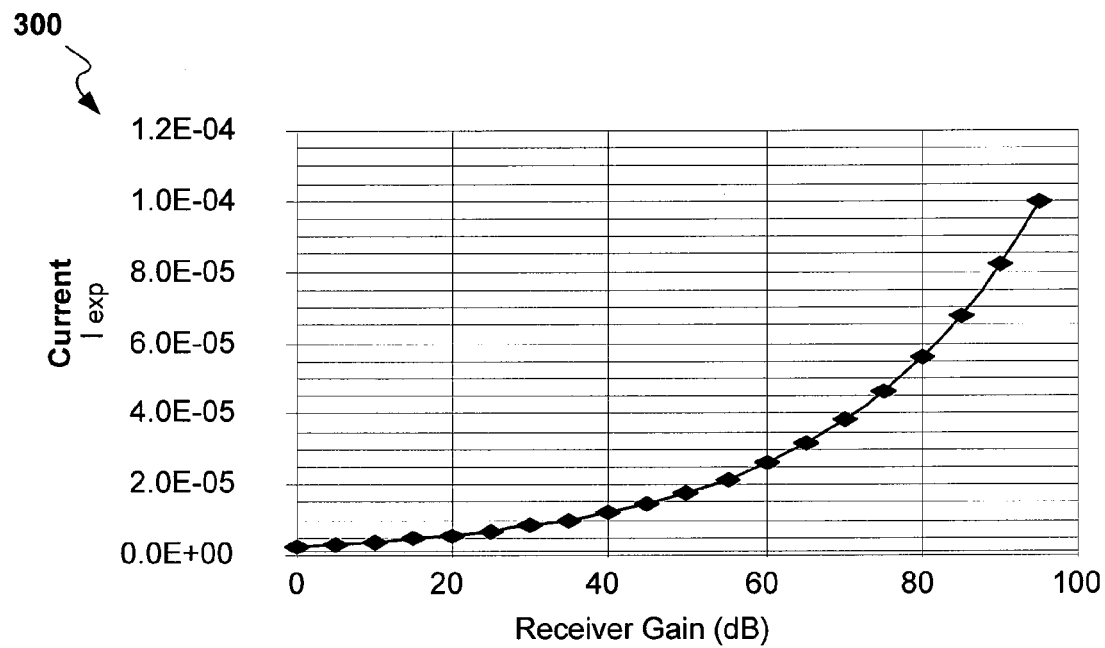
FIG. 3 shows a graph that illustrates the relationship between exponential current and receiver gain.

FIG. 3 shows a graph that illustrates the above exponential current $I_{exp}$ as it varies with receiver gain.

Figure 4:
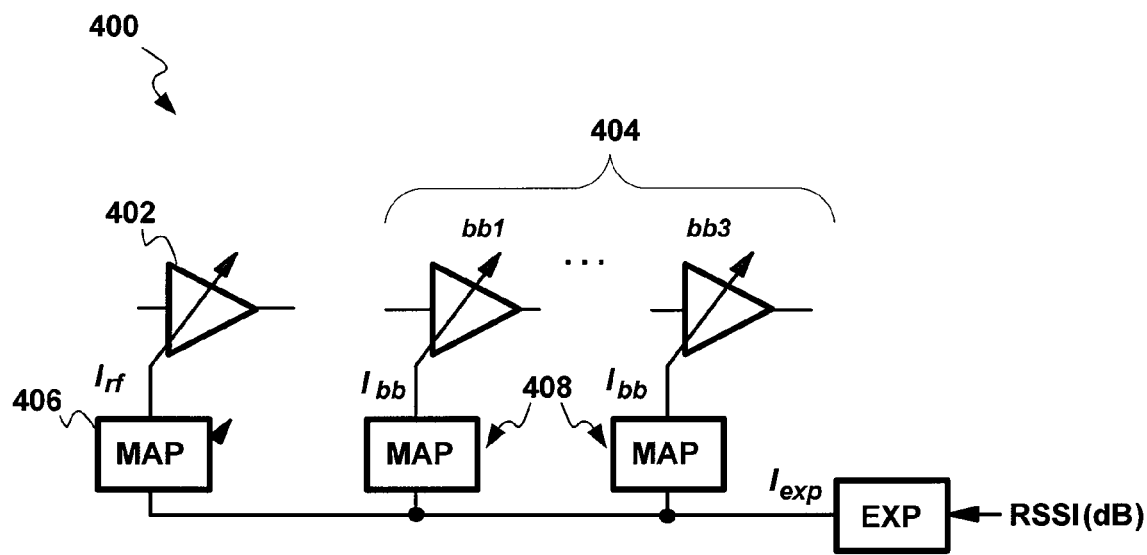
FIG. 4 shows a diagram a receiver that comprises one embodiment of an AGC system.

FIG. 4 shows a diagram of a receiver that comprises one embodiment of an AGC system. The AGC system comprises the exponential current generator (exp), the rf mapping circuit 406, and the baseband mapping circuits shown generally at 408. The AGC system receives the exponential current $I_{exp}$, which forms a basis that maps (via the mapping circuits 406, 408) to form multiple control signals that are input to associated variable gain amplifiers. Since the exponential current $I_{exp}$ simultaneously controls multiple amplifiers, its required control range shrinks.

For the following description, it will be assumed that the receiver comprises an rf variable gain amplifier 402 and three baseband (bb) variable gain amplifiers, shown generally at 404. During operation, the three baseband variable gain amplifiers are adjusted in tandem, and as a result, the control range is reduced to;

$$\Delta G_{exp} = \frac{G_{range}}{3}$$

where $\Delta G_{exp}$ is the range of the exponential current defined as;

$$\Delta G_{exp} = 20\log\left(\frac{I_{sw}}{I_{min}}\right)$$

and $G_{range}$ is the overall gain control range of the system. (The currents $I_{min}$ and $I_{sw}$ correspond to the exponential currents needed to control the baseband variable gain amplifiers.) This approach advantageously raises the minimum current $I_{min}$ above the noise floor, while lowering the maximum current $I_{sw}$ and reducing power consumption. As a result, the exponential current $I_{exp}$ can be mapped to directly control the gain of the baseband amplifiers 404 using the control signals $I_{bb}$, where $I_{bb} = I_{exp}$ from $I_{min}$ to $I_{sw}$.

Figure 5:
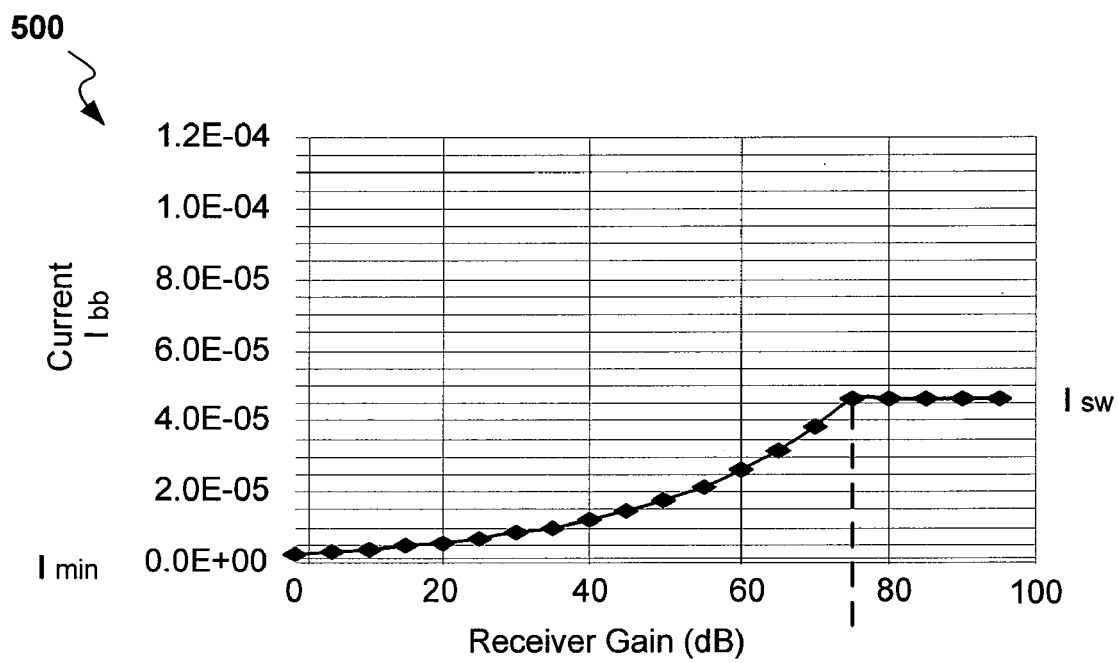
FIG. 5 shows a graph that illustrates how, in one embodiment, an exponential current is limited to a maximum value.

FIG. 5 shows a graph 500 that illustrates the result of a maximum limit applied to the exponential current $I_{exp}$ to form the control signal $I_{bb}$. As illustrated in the graph 500, the current increases from a minimum $I_{min}$ to a maximum limit shown at $I_{sw}$, which occurs at a gain of approximately 75 dB above the minimum gain of the receiver.

Above the current $I_{sw}$ (i.e., above 75 dB of receiver gain), the rf variable gain amplifier 402 takes over. It is preferable that the gain of the rf variable gain amplifier 402 change at the same rate as the tandem of three baseband variable gain amplifiers 404, meaning its gain control signal ($I_{rf}$ shown in FIG. 4) should obey a cube function as expressed by;

$$I_{rf} = k(I_{exp})^3$$

where $I_{exp}$ ranges from $I_{sw}$ to $I_{max}$, and where k is a scaling constant.

Figure 6:
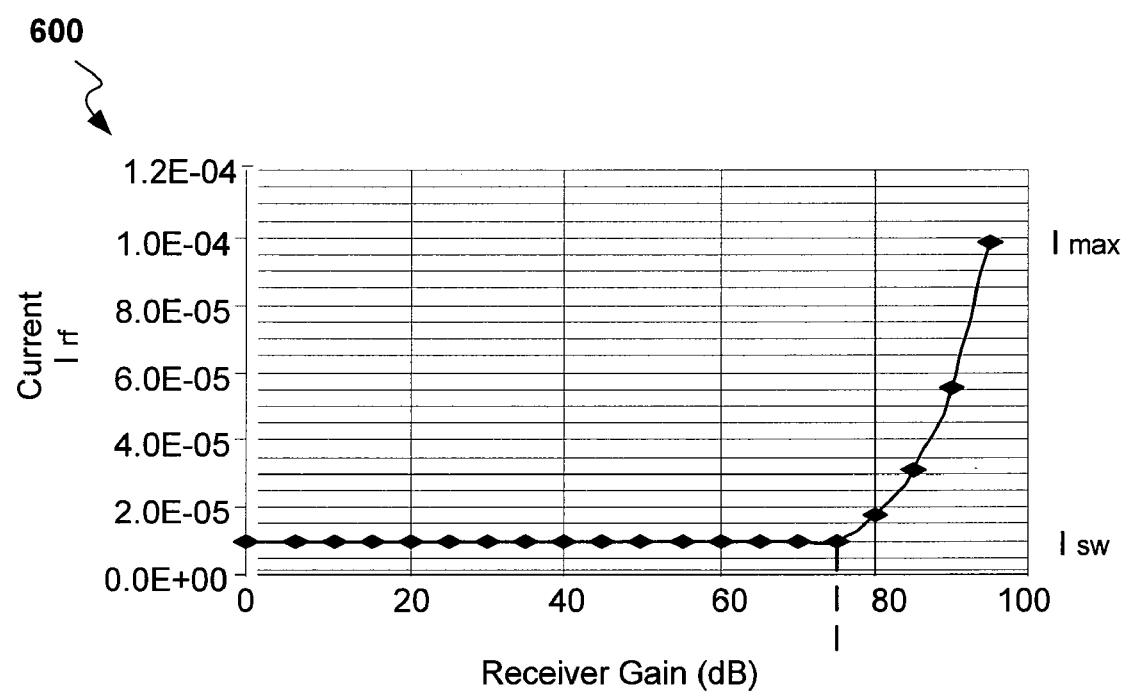
FIG. 6 shows a graph that illustrates how, in one embodiment, an exponential current is limited to a minimum value.

FIG. 6 shows a graph 600 that illustrates the result of a minimum limit applied to the exponential current to form the control signal $I_{rf}$. As illustrated in the graph 600, the current increases from a minimum value $I_{sw}$ to a maximum limit $I_{max}$, starting from a point that corresponds to the same gain as where the current $I_{sw}$ is reached in FIG. 5.

Figure 7:
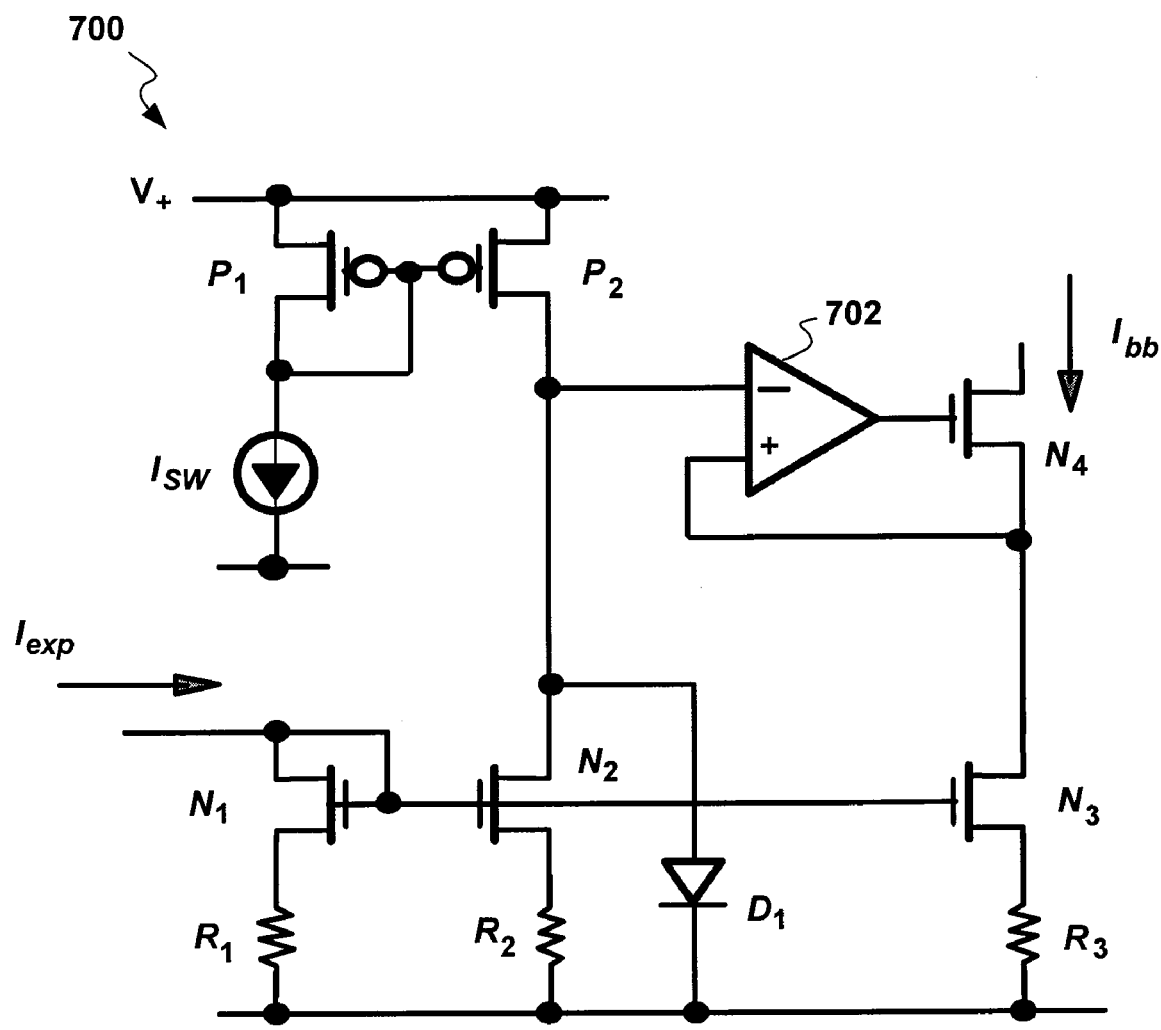
FIG. 7 shows a diagram of one embodiment of an AGC mapping circuit that limits the maximum output level.

FIG. 7 shows a diagram of one embodiment of a mapping circuit 700 that limits an exponential current to a maximum level. For example, the mapping circuit 700 is suitable for use as the mapping circuits 408 shown in FIG. 4. The mapping circuit 700 operates to limit the exponential current $I_{exp}$ to a maximum value equal to the current $I_{sw}$ as shown in the graph 500. A current mirror establishes the exponential current $I_{exp}$ in devices $N_2$ and $N_3$. A similar current mirror (transistors $P_1$-$P_2$) sets the current $I_{sw}$. The diode $D_1$ provides a path for the excess current when current $I_{sw}$ is larger than current $I_{exp}$ and sets the voltage at the non-inverting input to the operational amplifier 702 (plus the voltage at the drain of transistor $N_3$). When the current $I_{exp}$ exceeds the current $I_{sw}$, transistor $N_2$ is pushed into triode region to limit its current to $I_{sw}$. The operational amplifier 702 forces the voltage at the drain of transistor $N_3$ to follow the voltage at the drain of transistor $N_2$ so that transistor $N_3$ also limits to the current $I_{sw}$. Degeneration resistors (R1 thru R3) are added to the NMOS current mirrors (devices $N_1$ thru $N_3$) to increase the sensitivity of the network as the drain-source voltage decreases (in triode region). As a result, the output current $I_{bb}$ equals the exponential current $I_{exp}$ to a maximum level of $I_{sw}$, where it flattens out.

Figure 8:
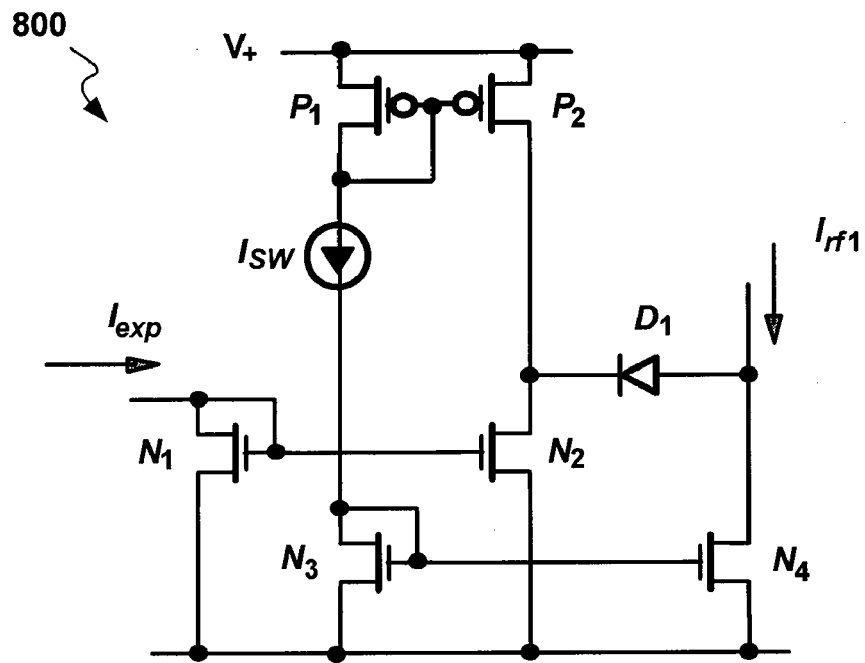
FIG. 8 shows a diagram of one embodiment of an AGC mapping circuit that limits the minimum output level.

FIG. 8 shows a diagram of one embodiment of a mapping circuit 800 that prevents an output current ($I_{rf1}$), (which is based on the exponential current $I_{exp}$) from falling below the current $I_{sw}$. A set of three current mirrors establishes current $I_{exp}$ in transistor $N_2$ and current $I_{sw}$ in transistors $N_4$ and $P_2$. The diode $D_1$ remains biased off until the current $I_{exp}$ exceeds the current $I_{sw}$, at which point, the excess current $I_{exp}$-$I_{sw}$ flows through the diode $D_1$ from the output. As a result, the output current $I_{rf1}$ follows the current $I_{exp}$ at high levels but flattens out (to the level of $I_{sw}$) at low levels of current $I_{exp}$.

Figure 9:
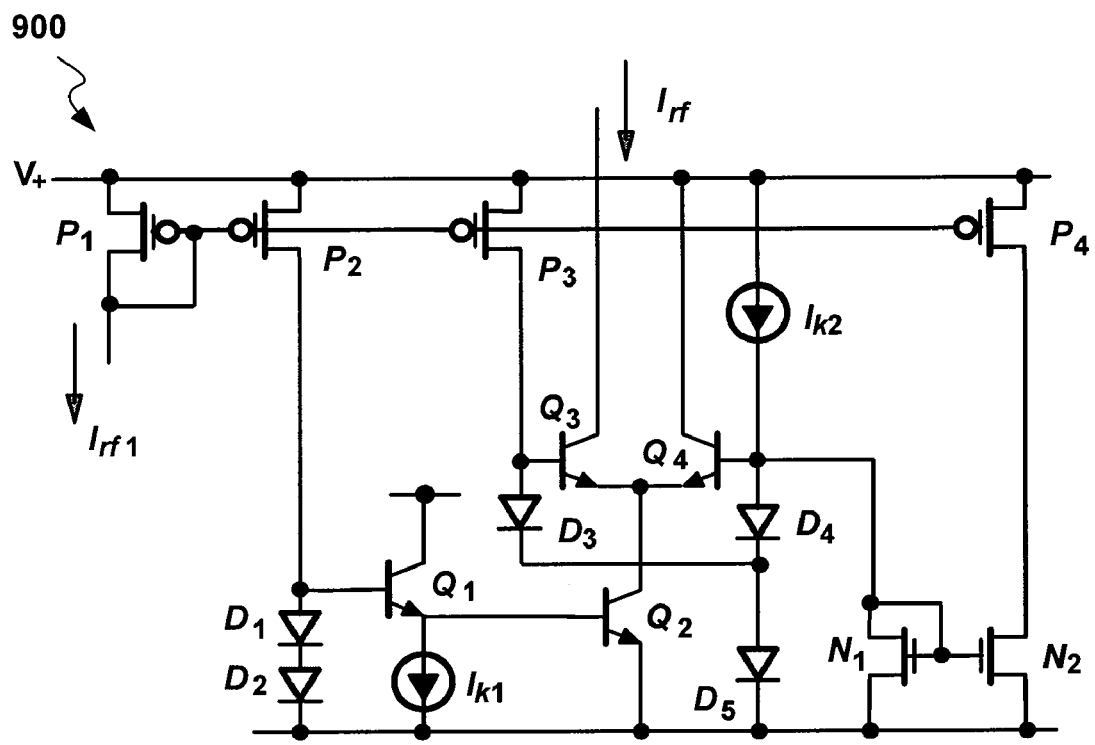
FIG. 9 shows a diagram of one embodiment of a cube circuit suitable for use in one or more embodiments of the AGC system.

FIG. 9 shows a diagram of one embodiment of a cube circuit 900 that scales the current $I_{rf1}$ by the power three to produce a control current $I_{rf}$ as required by one or more embodiments of the AGC system. For example, in one embodiment the mapping circuit 800 and the cube circuit 900 are suitable for use at the mapping circuit 406 in FIG. 4. In one embodiment, the cube circuit comprises an analog squarer and multiplier based on translinear principles. The current $I_{rf1}$ is mirrored by transistor $P_1$ to transistor $P_2$ and diodes $D_1$-$D_2$, setting the bias of transistors $Q_1$-$Q_2$ such that;

$$I_{D1}I_{D2}=I_{Q1}I_{Q2}$$

The constant current $I_{k1}$ flowing through transistor $Q_1$ results in;

$$I_{Q2} = \frac{I_{rf1}^2}{I_{k1}}$$

which is the square of the input current $I_{rf1}$. The input current $I_{rf1}$ is also mirrored to transistors $P_3$ and $P_4$. This forces the input current $I_{rf1}$ through diode $D_3$ and transistor $N_1$. The current flowing through diode $D_4$ is then $I_{k2}$-$I_{rf1}$, with the current $I_{k2}$ constant and greater than the maximum value of $I_{rf1}$.

The current $I_{Q2}$ flows through transistors $Q_3$ and $Q_4$ with;

$$I_{Q2}=I_{Q3}+I_{Q4}$$

These currents also satisfy the relationship;

$$\frac{I_{Q3}}{I_{Q4}} = \frac{I_{D3}}{I_{D4}}$$

which allows current $I_{Q4}$ to be rewritten as;

$$I_{Q4} = I_{Q3}\left(\frac{I_{k2} - I_{rf1}}{I_{rf1}}\right) = I_{Q3}\left(\frac{I_{k2}}{I_{rf1}} - 1\right)$$

Substituting into the expression for $I_{Q2}$ yields;

$$I_{Q2} = \frac{I_{rf1}^2}{I_{k1}} = I_{Q3}\left(\frac{I_{k2}}{I_{rf1}}\right)$$

which simplifies to the desired cube function to produce the control current $I_{Q3}$ ($I_{rf}$);

$$I_{Q3} = \frac{I_{rf1}^3}{I_{k1}I_{k2}}$$

A fixed current $I_{k2}$ flows through diode $D_5$ to set a constant operating point for transistors $Q_3$-$Q_4$.

Figure 10:
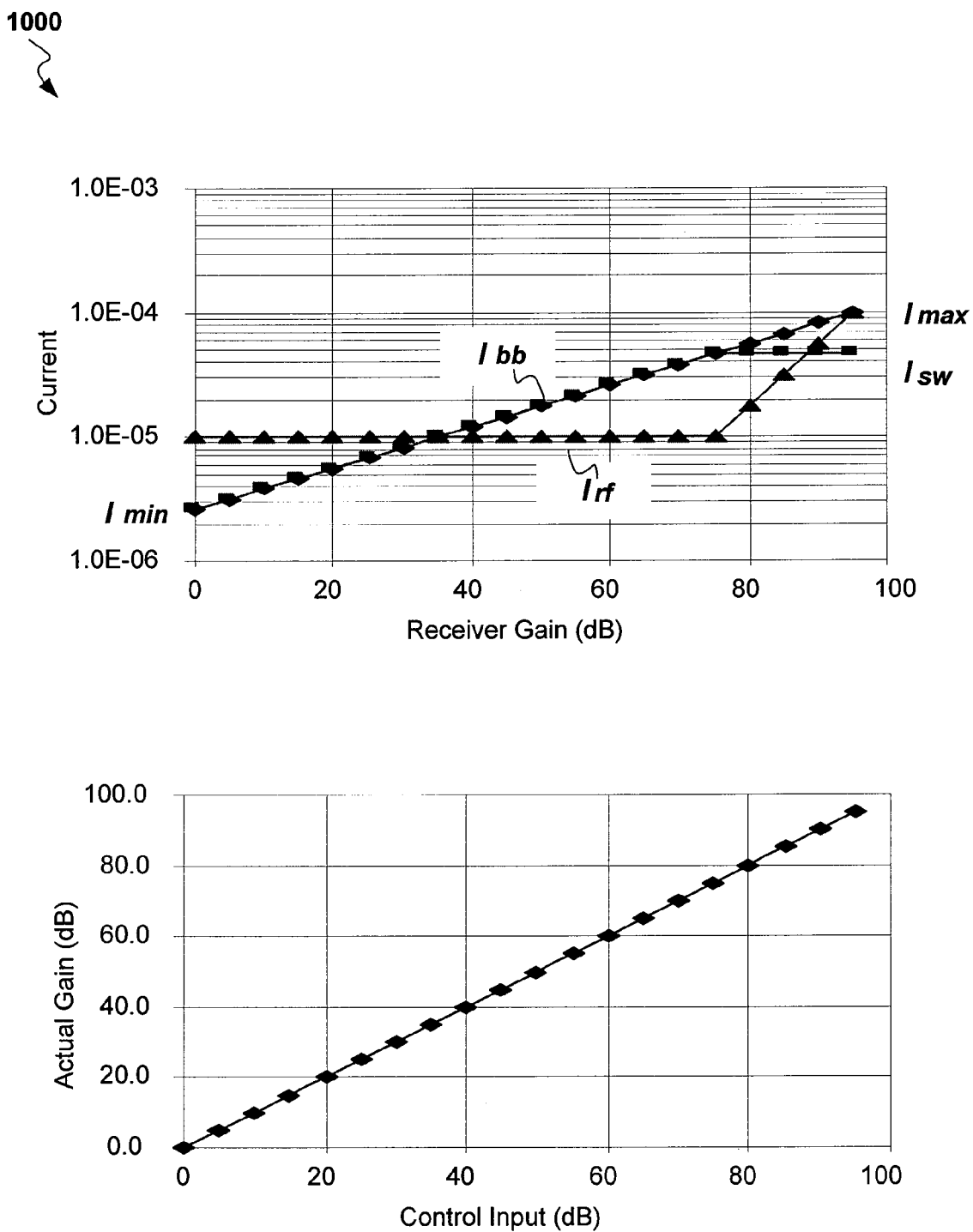
FIG. 10 shows graphs that illustrate the response of one embodiment of the multi-segment gain control system.

FIG. 10 shows graphs 1002 and 1004 that illustrate a smooth multi-segment gain control response that results from piecing together the operation of the different mapping circuits provided in one or more embodiments of an AGC system. Referring to graph 1002, the current $I_{max}$ is set to 100 μA by design, which means the current $I_{min}$ is 2.6 μA and the current $I_{sw}$ is 46.4 μA. The resulting control currents $I_{bb}$ and $I_{rf}$ are shown. Referring to graph 1004, the resulting gain response of the AGC system is shown to be smooth and linear.

Other gain control responses (for use with different radio systems and any number of variable gain amplifiers) are possible with similar results provided the basis current $I_{exp}$ and switching current(s) are shared. In one or more embodiments, the AGC system incorporates a variety of limiting and scaling circuits including, but not limited to, linear, cube, square and square root circuits.

Figure 11:
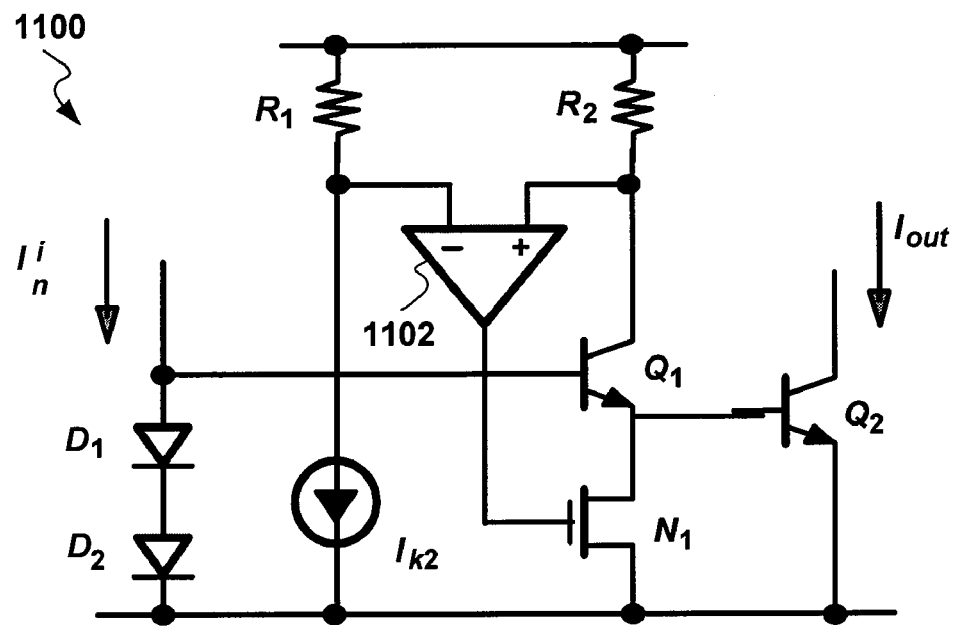
FIG. 11 shows a diagram of one embodiment of an improved square circuit that is suitable for use in one or more embodiments of the AGC system.

FIG. 11 shows a diagram of one embodiment of an improved square circuit that is suitable for use in one or more embodiments of the AGC system. Diodes $D_1$-$D_2$ plus transistors $Q_1$-$Q_2$ form a translinear loop described by;

$$I_{D1}I_{D2}=I_{Q1}I_{Q2}$$

Ideally, the current $I_{k2}$ is constant; unfortunately, this is not possible with a standard current mirror. The potential at the emitter of transistor $Q_1$ decreases and nearly vanishes at low current levels ($I_{in}$), pushing the current source transistor into saturation (bipolar device) or triode region (MOS device). This differs from the input side of the mirror and results in mismatches. To avoid this, an operational amplifier feedback loop is added. It uses resistor $R_2$ to monitor the current flow through transistor $Q_1$ and adjusts the gate voltage applied to current source transistor $N_3$ accordingly. Current source $I_{k2}$ and resistor $R_1$ provide a reference to the operational amplifier 1102.

Figure 12:
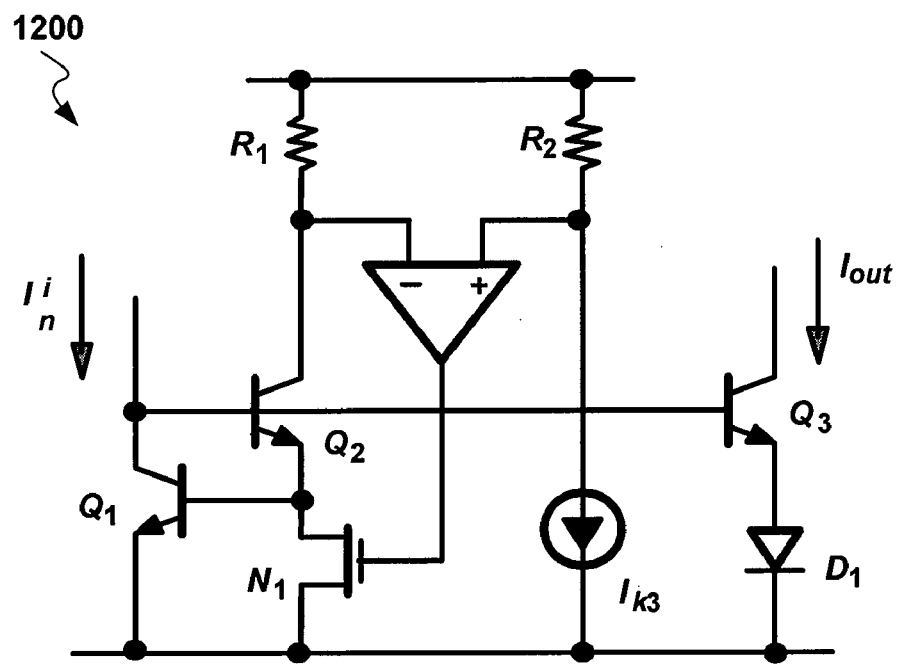
FIG. 12 shows a diagram of one embodiment of an improved square-root circuit that is suitable for use in one or more embodiments of the AGC system.

FIG. 12 shows a diagram of one embodiment of an improved square root circuit that is suitable for use in one or more embodiments of the AGC system. The square root circuit uses operational amplifier feedback to create a constant current source. Transistors $Q_1$-$Q_4$ form a translinear loop where;

$$I_{Q1}I_{Q2}=(I_{Q3})^2$$

The input current $I_{in}$ biases transistor $Q_1$, while a constant current $I_{k3}$ is established in transistor $N_1$. As a result;

$$I_{Q3}=\sqrt{I_{in}I_{k3}}$$

which is the desired square-root operation.

Figure 13:
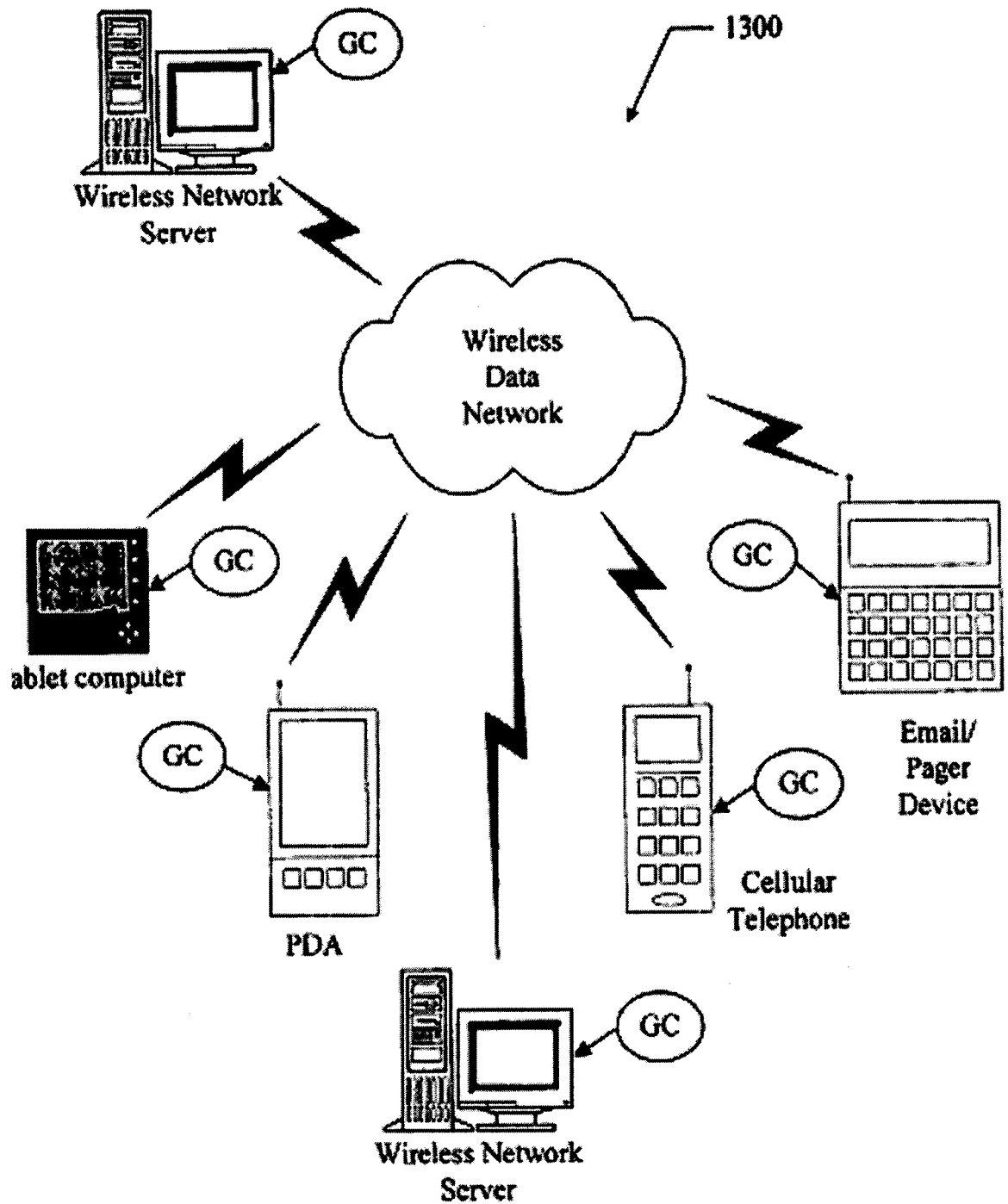
FIG. 13 shows a communication network that includes various communication devices that comprise one or more embodiments of a multi-segment gain control system.

FIG. 13 shows a communication network 1300 that includes various communication devices that comprise one or more embodiments of a multi-segment gain control (GC)

system. The network 1300 includes multiple network servers, a tablet computer, a personal digital assistant (PDA), a cellular telephone, and an email/pager device all communicating over a wireless data network. Each of the devices includes one or more embodiments of a GC system as described herein. The network 1300 illustrates only some of the devices that may comprise one or more embodiments of a GC system. However, it should be noted that one or more embodiments of a GC system are suitable for use in virtually any type of communication device.

Accordingly, while one or more embodiments of a multi-segment gain control system have been illustrated and described herein, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. Apparatus for providing a multi-segment gain control, the apparatus comprising:
   logic to convert a gain control signal to an exponential signal; and
   logic to map the exponential signal to generate a first control signal and a second control signal; said first control signal and said second control signal provided to independently control a first gain segment and a second gain segment to produce multi-segment gain control; wherein said multi-segment control follows a predefined square law gain characteristic.

2. Apparatus for providing a multi-segment gain control, the apparatus comprising:
   logic to convert a gain control signal to an exponential signal; and
   logic to map the exponential signal to generate a first control signal and a second control signal; said first control signal and said second control signal provided to independently control a first gain segment and a second gain segment to produce multi-segment gain control; wherein said multi-segment control follows a predefined square-root law gain characteristic.

3. Apparatus for providing a multi-segment gain control, the apparatus comprising:
   logic to convert a gain control signal to an exponential signal; and
   logic to map the exponential signal to generate a first control signal and a second control signal; said first control signal and said second control signal provided to independently control a first gain segment and a second gain segment to produce multi-segment gain control; wherein said multi-segment control follows a predefined cubic law gain characteristic.

4. Apparatus for providing multi-segment gain control in a communications device, the apparatus comprising:
   logic to generate a gain control signal from a control signal, said logic to generate a gain control signal comprising logic to generate an exponential signal; and
   logic to map the gain control signal to generate a plurality of gain segment control signals;
   wherein ones of the gain segment control signals are provided to independently control ones of a plurality of gain control segments to provide a predefined gain characteristic, and wherein said predefined gain characteristic is a square law gain characteristic.

5. Apparatus for providing multi-segment gain control in a communications device, the apparatus comprising:
   logic to generate a gain control signal from a control signal, said logic to generate a gain control signal comprising logic to generate an exponential signal; and
   logic to map the gain control signal to generate a plurality of gain segment control signals;
   wherein ones of the gain segment control signals are provided to independently control ones of a plurality of gain control segments to provide a predefined gain characteristic, and wherein said predefined gain characteristic is a square root law characteristic.

6. Apparatus for providing multi-segment gain control in a communications device, the apparatus comprising:
   logic to generate a gain control signal from a control signal said logic to generate a gain control signal comprising logic to generate an exponential signal; and
   logic to map the gain control signal to generate a plurality of gain segment control signals;
   wherein ones of the gain segment control signals are provided to independently control ones of a plurality of gain control segments to provide a predefined gain characteristic, and wherein said predefined gain characteristic is a cubic law gain characteristic.

* * * * *